(12) United States Patent
Mallinson

(10) Patent No.: US 8,504,601 B2
(45) Date of Patent: Aug. 6, 2013

(54) FIR FILTER WITH REDUCED ELEMENT COUNT

(75) Inventor: A. Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 13/425,348

(22) Filed: Mar. 20, 2012

(65) Prior Publication Data
US 2012/0246208 A1 Sep. 27, 2012

Related U.S. Application Data

(60) Provisional application No. 61/466,424, filed on Mar. 22, 2011.

(51) Int. Cl.
*G06F 17/10* (2006.01)

(52) U.S. Cl.
USPC ........... 708/300; 708/208; 708/301; 708/400; 708/403

(58) Field of Classification Search
None
See application file for complete search history.

(56) References Cited

U.S. PATENT DOCUMENTS

| | | | |
|---|---|---|---|
| 5,034,908 A * | 7/1991 | Hartley et al. | 708/319 |
| 7,116,076 B2 | 10/2006 | Sippola et al. | |
| 7,315,876 B2 * | 1/2008 | Landolt | 708/301 |
| 7,346,638 B2 | 3/2008 | Lin et al. | |
| 7,570,704 B2 * | 8/2009 | Nagarajan et al. | 375/295 |
| 2004/0139135 A1 | 7/2004 | Druck | |
| 2006/0123075 A1 | 6/2006 | Mallinson | |
| 2006/0235924 A1 | 10/2006 | Stewart | |

OTHER PUBLICATIONS

R. Woods, et al. (2008), FPGA-based Implementation of Signal Processing Systems, Wiley and Sons, Ltd., Chippenham, Great Britain (accessible at http://www.progetti.t3lab.it/vialab/wp-content/uploads/download/20110517/FPGA-based%20Implementation%20of%20Complex%20Signal%20Processing%20System~tqw~_darksiderg.pdf), pp. 1-388.

* cited by examiner

*Primary Examiner* — Michael D Yaary
(74) *Attorney, Agent, or Firm* — Gard & Kaslow LLP

(57) ABSTRACT

A finite impulse response (FIR) filter having a differential output and capable of having negative coefficients, and a method of designing the filter, is disclosed. In contrast to the prior art, in which two output signals requires the use of two identical sets of impedance devices corresponding to the Fourier coefficients that create the desired response of the filter, the described method and system uses only a single set of impedance devices, and thus approximately one-half of the number of impedance devices used in the prior art. This is accomplished by appropriately selecting which resistors contribute to which output, so that a differential output may be obtained that is substantially the same as if impedance devices corresponding to all of the coefficients were used for each signal.

15 Claims, 7 Drawing Sheets

FIR FILTER WITH REDUCED ELEMENT COUNT

This application claims priority from Provisional Application No. 61/466,424, filed Mar. 22, 2011, which is incorporated by reference in its entirety.

FIELD OF THE INVENTION

The present invention relates generally to electronic filters, and more particularly to finite impulse response (FIR) filters.

BACKGROUND OF THE INVENTION

A finite impulse response (FIR) filter is a type of electronic filter with a broad range of applications. FIR filters are widely used in both digital signal processing and digital video processing, and their construction is well known in the prior art.

One type of FIR filter is a transversal filter, or tapped delay line filter, as shown in FIG. 1. The output of such a filter is a weighted combination of voltages taken from uniformly spaced taps, and thus a weighted sum of the current input value and a finite number of previous values of the input. The output is proportional to the sum of the delayed voltages divided by the resistances connected to the respective voltages. The proportionality of the output is thus a constant, the constant being the parallel impedance of all the resistances.

The filter contains a plurality (here 7 are shown) of unit delay elements U1 to U7, each of which introduces a delay of time t. The filter is considered to be of the Mth order, where M−1 is the number of delay elements, so the filter of FIG. 1 is an $8^{th}$ order filter. The output of each of the delay elements U1 to U7 is connected to an element having impedance, here shown as a resistor R1 to R7, typically through some buffering means, such as buffers Z1 to Z7. The resistors all share a common output point, (Other elements having impedance may be used rather than resistors, such as, for example, capacitors or inductors.)

As an input signal $S_n$ progresses through the delay elements, its contribution to the output voltage varies in time; each resistor causes the signal on the respective delay element to which it is attached to contribute to the output signal in inverse proportion to the resistor value. Thus, if the resistor is small, the signal on the attached delay element will have a large contribution to the output voltage, while if the resistor is large the contribution to the output will be smaller.

It is well known that the mathematical basis of a FIR filter is the mathematics of Fourier transforms. By properly selecting the resistor values a set of resistors as the inverse of a set of Fourier coefficients that is calculated to provide a desired frequency response, a FIR filter is designed to provide an output with that response. The resistor values are typically calculated by a software program which takes the desired frequency response as an input.

One limitation of the circuit of FIG. 1 is that while the output is the weighted sum of the delayed signal, the weights all have to be positive numbers, as the circuit as shown does not have the ability to implement negative coefficients. This limits the use of the circuit of FIG. 1, since while most of the Fourier coefficients for a desired frequency response will be positive numbers, even for an output considered positive some coefficients may be negative, requiring a negative resistance value which cannot be constructed directly.

It is also well known how to construct a differential version of the circuit of FIG. 1. FIG. 2 shows another FIR filter with a set of delay elements U1 to U6, buffers Z1 to Z6, a first set of resistors R1 to R6, and a second set of resistors R7 to R12.

Unlike the buffers in FIG. 1, the buffers Z1 to Z6 in FIG. 2 are differential buffers that provide two outputs, both a non-inverting output that follows the input to the driver, and an inverting output that inverts the input to the driver. (As is conventional, this inversion is indicated by the small circle or "bubble" on the differential buffers Z1 to Z6 in FIG. 2.)

Resistors R1 to R6 are all connected to the non-inverting outputs of differential buffers Z1 to Z6 in FIG. 2, and the output voltage "Out" is the sum of the voltages from resistors R1 to R6. The second set of resistors R7 to R12 is a duplicate set of the resistors R1 to R6; however, resistors R7 to R12 are all connected to the inverted outputs of differential buffers Z1 to Z6 in FIG. 2. The output voltage "Outb" from resistors R7 to R12 is the sum of the voltages from resistors R7 to R12.

Since resistors R7 to R12 have the same values as resistors R1 to R6 respectively, but are connected to the inverting outputs of differential buffers Z1 to Z6, the output signal "Outb" is thus the complement of "Out" and the difference between "Out" and "Outb" forms a differential output signal. Such differential signals may, for example, be used to suppress common mode errors and reduce noise.

In FIG. 2, all of the coefficients that contribute to "Out" are again positive numbers, as in FIG. 1, since resistors R1 to R6 are all connected to the non-inverting outputs of the differential buffers Z1 to Z6. (Since resistors R7 to R12 have the same values as resistors R1 to R6, they represent the same positive coefficients and form "Outb" as the complement of "Out" because they are connected to the inverting outputs of the buffers.) However, the use of a circuit such as that shown in FIG. 2 has another advantage, i.e., that a negative coefficient may now be easily created. This is easily accomplished simply by swapping the output connections of a pair of resistors.

An example of this is shown in FIG. 3. The filter in FIG. 3 is nearly identical to that of FIG. 2, except that resistors R4 and R10 are now connected to the opposite outputs from their connections in FIG. 2. In FIG. 2, resistor R4 contributes to the output "Out," and resistor R10 contributes to the output "Outb." In FIG. 3, resistor R4 instead contributes to the output "Outb," and resistor R10 contributes to output "Out." The result of this is that the contributions from the outputs of resistors R4 and R10 are now inverted relative to the other resistors; this has the effect that the signal after delay element U4 is now subject to a negative coefficient in its weighting toward the outputs. Any other negative coefficients desired in a particular filter may be obtained in the same fashion.

As stated above, in this example the resistors R7 to R12 in FIGS. 2 and 3 have the same values as resistors R1 to R6 in those figures. Thus, this known architecture for generating negative coefficient values and a differential output requires two sets of resistors, each set having a resistor corresponding to each of the Fourier coefficients determined to provide a desired frequency response, and where each resistor in the second set is a duplicate of a resistor in the first set.

SUMMARY OF THE INVENTION

A method and system is disclosed for designing a finite impulse response (FIR) filters that produces a differential output having a desired frequency response and capable of having negative coefficients, using approximately the same number of resistors as in the non-differential case, e.g., half the number of resistors as is commonly used in the prior art to make a filter with a differential output.

In one embodiment, a method of designing a finite impulse response filter having a desired frequency response and a differential output having a first output signal and a complement output signal is disclosed, the method comprising:

determining a set of N Fourier coefficients that result in the desired impulse response; calculating a set of N impedance values that correspond to the determined Fourier coefficients; scaling the calculated impedance values to a desired range; constructing an inverting delay line comprised of N inverting delay elements; connecting impedance devices having the scaled impedance values to the delay line, one after each delay element in the order of the Fourier coefficients to which the impedance values correspond; determining which impedance devices should contribute to the first output signal and which impedance devices should contribute to the complement output signal; and connecting the impedance devices which should contribute to the first output signal to a first output terminal and the impedance devices which should contribute to the complement output signal to the a second output terminal.

In another embodiment, method of designing a finite impulse response filter having a desired frequency response and a differential output having a first output signal and a complement output signal is disclosed, the method comprising: determining a set of N Fourier coefficients that result in the desired impulse response; calculating a set of N impedance values that correspond to the determined Fourier coefficients; scaling the calculated impedance values to a desired range; constructing an inverting delay line comprised of N inverting delay elements; connecting N differential buffers to the delay line, one after each delay element, each differential buffer having an input, an inverting output and a non-inverting output, with the input connected to the delay line; connecting a first set of impedance devices having the scaled impedance values to the differential buffers in the order of the Fourier coefficients to which the impedance values correspond, where for each impedance device in the first set of impedance devices n=1 to N, if n is odd the impedance device is attached to the non-inverting output of the respective differential buffer and if n is even the impedance device is attached to the inverting output of the respective differential buffer; for each Fourier coefficient n=1 to N that is positive, connecting the output of the corresponding impedance device of the first set of impedance devices to a first output terminal; for each Fourier coefficient n=1 to N that is negative, connecting the output of the corresponding impedance device of the first set of impedance devices to a second output terminal; connecting a second set of impedance devices having the scaled impedance values to the differential buffers in the order of the Fourier coefficients to which the impedance values correspond, each impedance device in the second set of impedance devices attached to the opposite output of the respective differential buffer from the corresponding impedance device of the first set of impedance devices; for each Fourier coefficient n=1 to N that is positive, connecting the output of the corresponding impedance device of the second set of impedance devices to a second output terminal; for each Fourier coefficient n=1 to N that is negative, connecting the output of the corresponding impedance device of the second set of impedance devices to a first output terminal; removing all of the impedance devices connected to the inverting outputs of the differential buffers; and replacing the differential buffers with buffers having only non-inverting outputs.

A further embodiment discloses a finite impulse response filter having a desired frequency response and a differential output having a first output signal and a complement output signal, comprising: an inverting delay line comprised of N inverting delay elements; N impedance devices connected to the delay line, one after each delay element, the impedance devices having impedance values corresponding to N Fourier coefficients that result in the desired frequency response and connected to the delay line in the order of the Fourier coefficients to which the impedance values correspond; a first output terminal connected to a plurality of the impedance devices, where for a particular impedance device n=1 to N, if n is odd and the corresponding Fourier coefficient is positive, or if n is even and the corresponding Fourier coefficient is negative, the impedance device is one of the plurality of impedance devices connected to the first output terminal; and a complement output terminal connected to the impedance devices which are not connected to the first output terminal.

Still another embodiment discloses a non-transitory computer readable storage medium having embodied thereon instructions for causing a computing device to execute a method of designing a finite impulse response filter having a desired frequency response and a differential output having a first output signal and a complement output signal, the method comprising: determining a set of N Fourier coefficients that result in the desired impulse response; calculating a set of N impedance values that correspond to the determined Fourier coefficients; scaling the calculated impedance values to a desired range; constructing an inverting delay line comprised of N inverting delay elements; connecting impedance devices having the scaled impedance values to the delay line, one after each delay element in the order of the Fourier coefficients to which the impedance values correspond; determining which impedance devices should contribute to the first output signal and which impedance devices should contribute to the complement output signal; and connecting the impedance devices which should contribute to the first output signal to a first output terminal and the impedance devices which should contribute to the complement output signal to the a second output terminal.

DETAILED DESCRIPTION OF THE INVENTION

The present application describes a finite impulse response (FIR) filter having a differential output and capable of having negative coefficients using only the same number of resistors as in the non-differential case, e.g., approximately half the number of resistors as is commonly used in the prior art, and a method of designing such a filter.

One output signal of the differential output is created by using impedance devices corresponding to approximately one-half the Fourier coefficients that create a desired frequency response; the complement signal is created by using impedance devices corresponding to approximately the other half of the Fourier coefficients for the desired frequency response. Given the number of Fourier coefficients typically used in the art, using this number of impedance devices provides a signal that is substantially the same as if impedance devices corresponding to all of the coefficients were used. The method also uses a delay line that repeatedly inverts the signal, rather than merely delaying the signal as in the prior art; such a delay line may be achieved by a series of inverting delay elements.

Figure 1:
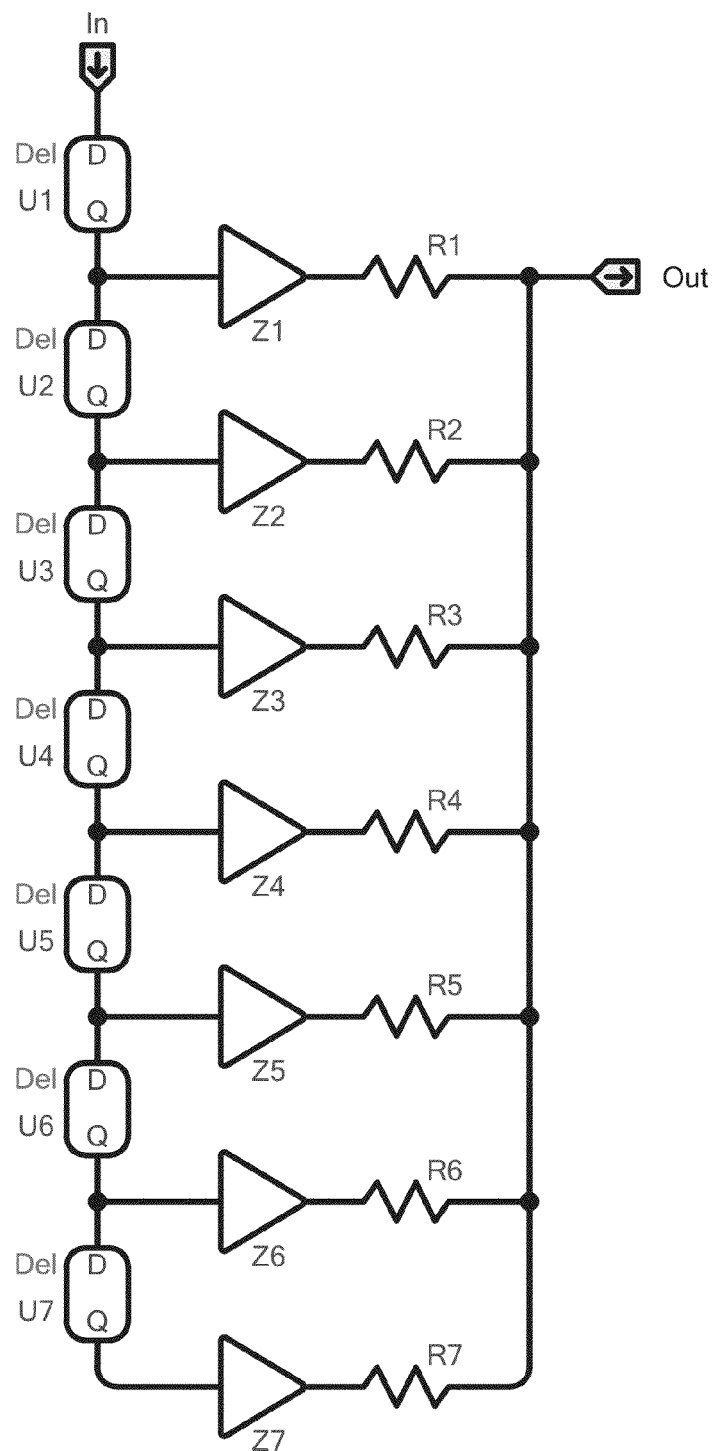
FIG. 1 is a block diagram of a finite impulse response (FIR) filter as known in the art.
Figure 2:
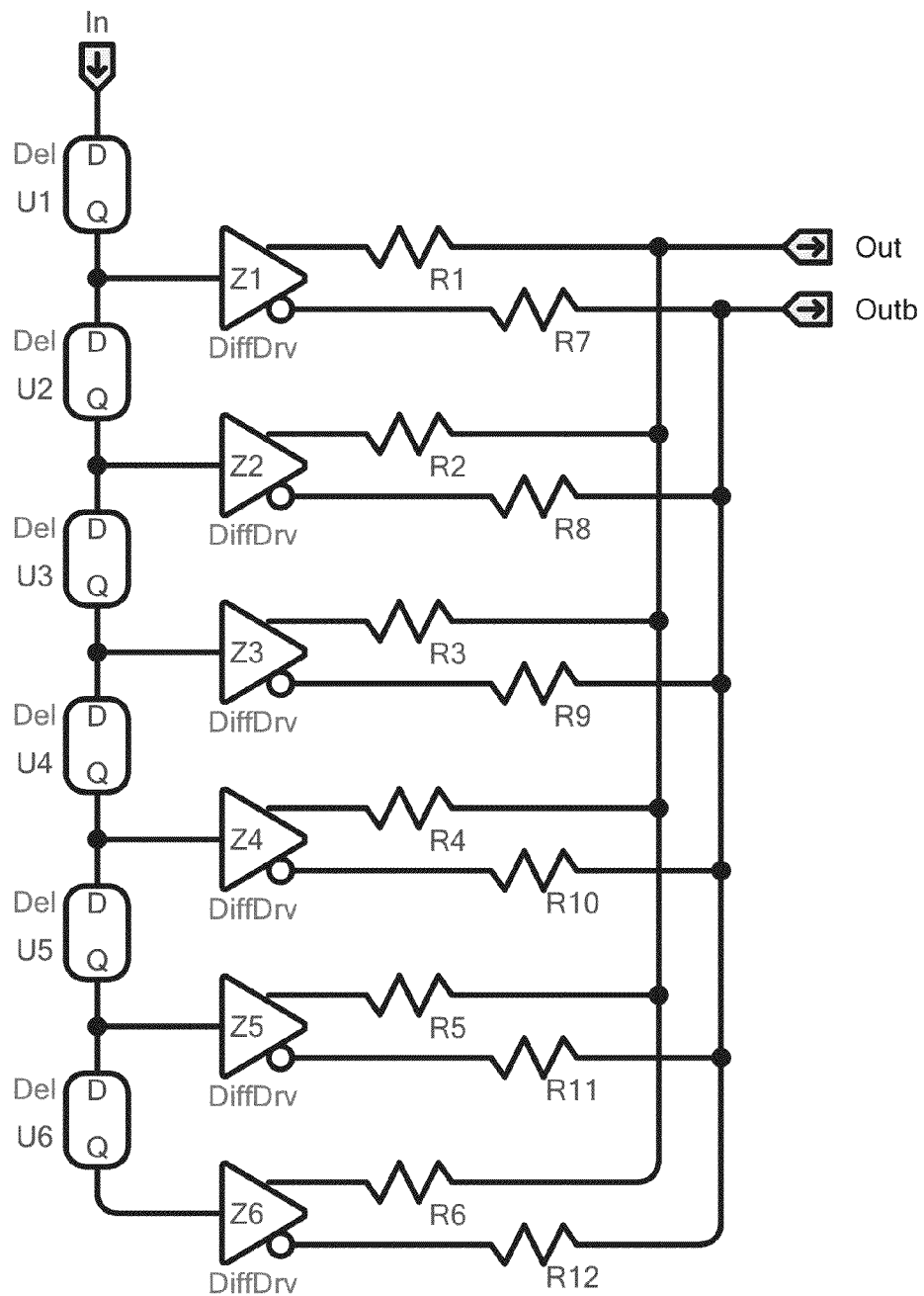
FIG. 2 is a block diagram of a finite impulse response (FIR) filter having a differential output as known in the art.
Figure 3:
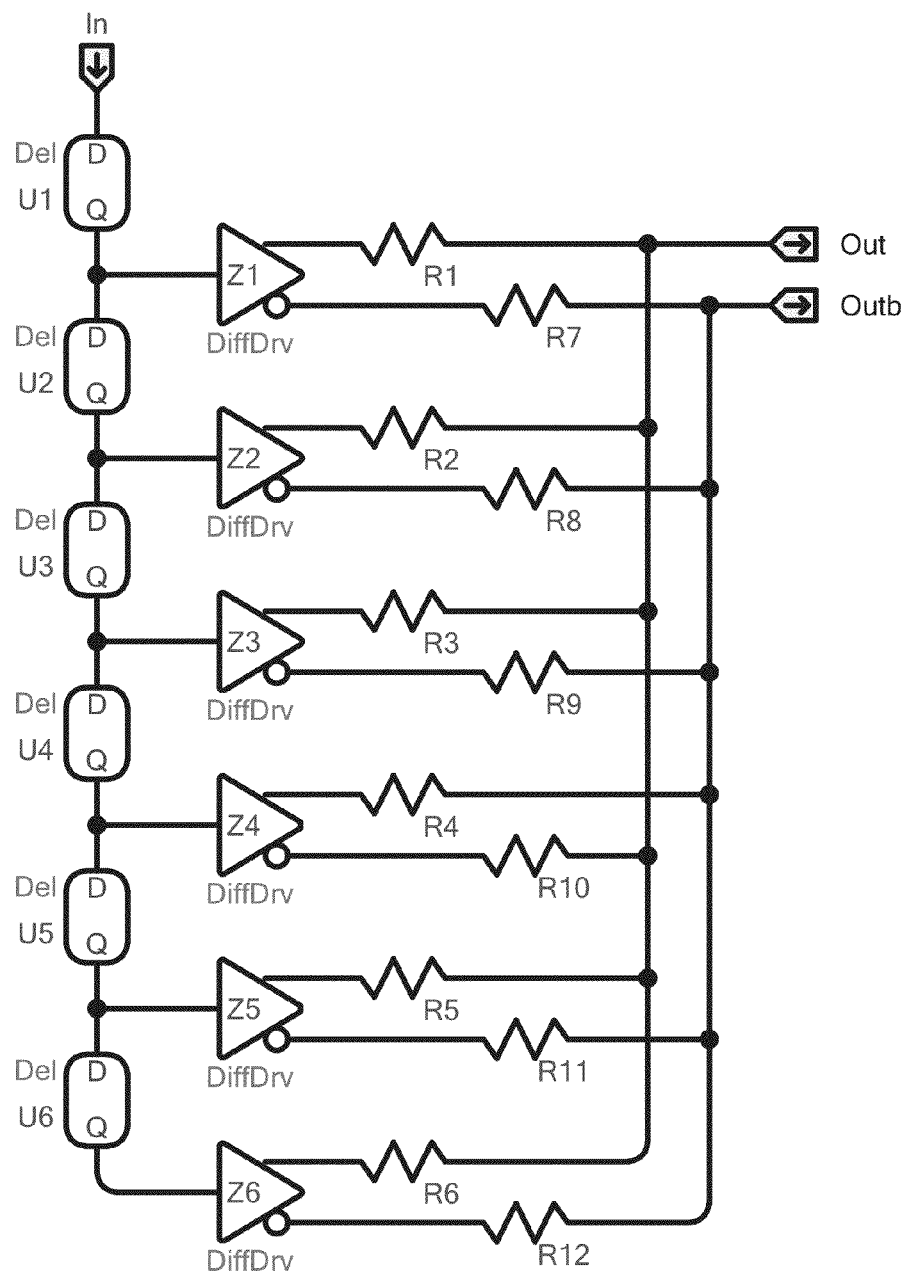
FIG. 3 is a block diagram of another finite impulse response (FIR) filter having a differential output as known in the art.
Figure 4:
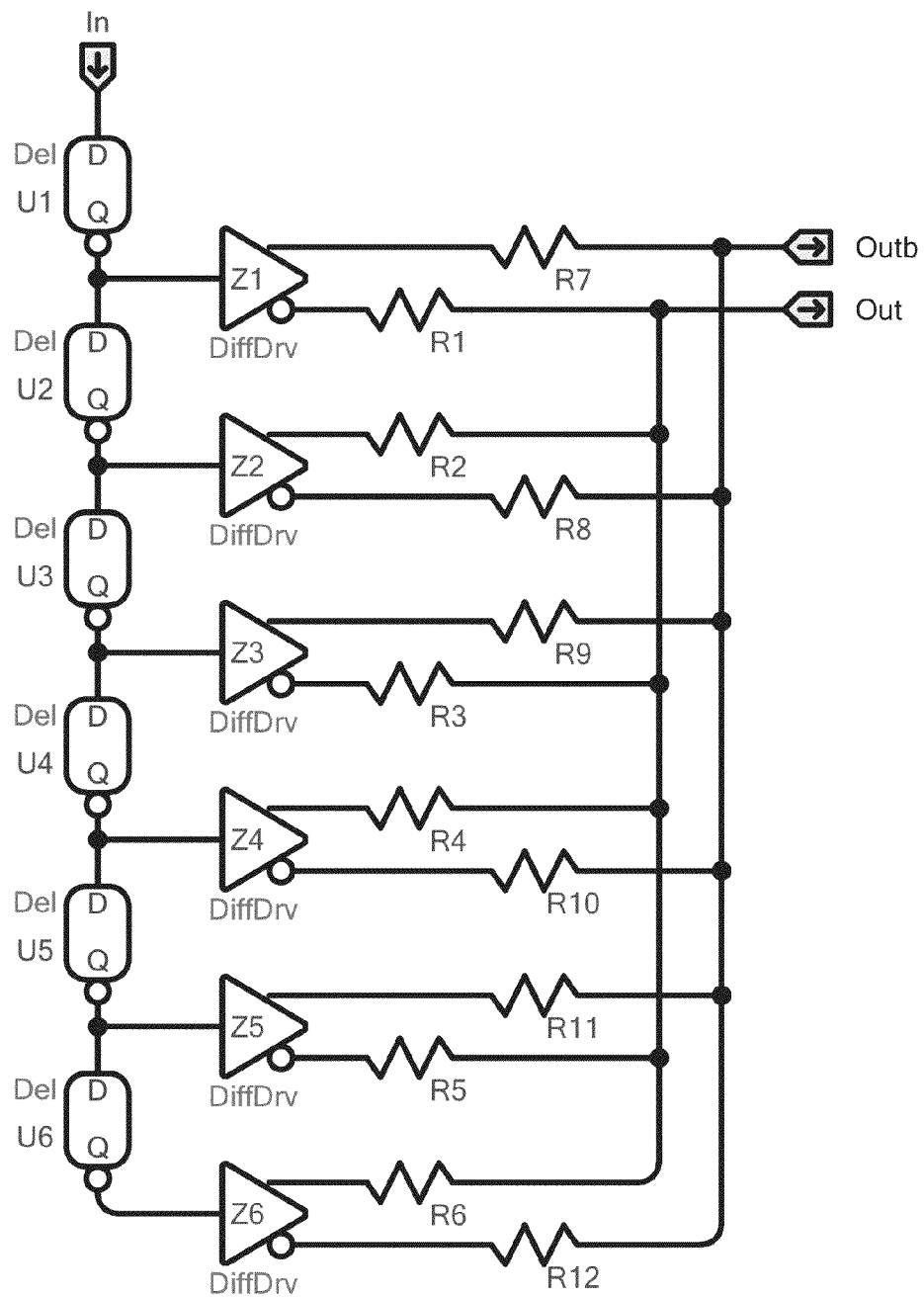
FIG. 4 is a block diagram of another finite impulse response (FIR) filter having a differential output as known in the art.

FIG. 4 shows a FIR filter having a differential output constructed with a delay line constructed from a series of inverting delay elements U1 to U6. As with the differential drivers of FIG. 3, the fact that the delay elements U1 to U6 invert the signal, unlike the delay elements in FIGS. 1 to 3, is shown by the small circle or "bubble" at the output Q of each delay element U1 to U6.

Each of the delay elements U1 to U6 inverts the signal it receives; thus, the output of the first delay element (and every odd-numbered delay element) is inverted with respect to the input signal $S_n$. The output of the second delay element, having been inverted twice, is not inverted with respect to the input signal $S_n$, but merely delayed; similarly, the output of every even-numbered delay element is not inverted with respect to the input signal $S_n$.

The circuit of FIG. 4 also shows differential drivers Z1 to Z6, the same type of drivers having both inverted and non-inverted outputs as the differential drivers in FIG. 3, a first set of resistors R1 to R6, which produces an output "Out," and a second set of resistors R7 to R12, which produces a second output "Outb."

However, as above the input signal $S_n$ is inverted by each delay element U1 to U6. As a result, the resistors R1 to R6 which produce the output "Out" are not all connected to the non-inverting side of differential drivers Z1 to Z6 as in FIG. 2. Doing so would result in every other resistor receiving a signal that is inverted with respect to the input signal $S_n$, and thus every other resistor would appear as a negative coefficient. For this reason, the signal from each delay element which results in an inverted signal must again be inverted if a positive coefficient, i.e., a positive resistor, is to be connected to the delay line at that point.

As shown in FIG. 4, differential driver Z1 is connected to the delay line after the first inverting delay element U1; differential driver Z1 thus receives an inverted signal. If resistor R1 were connected to the non-inverted output of differential driver Z1, it would be operating on that inverted signal and thus appear as a negative coefficient. To compensate for this, resistor R1 is instead connected to the inverted output of differential driver Z1. The two inversions of the signal, one by the delay element U1 and the other by differential driver Z1, effectively results in a non-inverted signal being received by resistor R1, which thus acts as a positive coefficient.

Similarly, as with differential driver Z1 and resistor R1, differential drivers Z3 and Z5 are connected to the delay line after an odd number of inverting delay elements. Thus, to act as positive coefficients, resistors R3 and R5 are also connected to the inverted outputs of differential drivers Z3 and Z5.

On the other hand, since differential drivers Z2, Z4 and Z6 are connected to the delay line after an even number of delay elements, they receive a signal that is effectively not inverted. Thus, resistors R2, R4 and R6 act as positive coefficients when connected to the non-inverting outputs of differential drivers Z2, Z4 and Z6.

It may similarly be seen resistors R7 to R12 in FIG. 4 all act as negative coefficients, since they all receive an output that is inverted an odd number of times. Resistor R7 is connected to the non-inverting output of differential driver Z1; however, since differential driver Z1 received an inverted signal from delay element U1, the signal has been inverted once, and resistor R7 thus functions as a negative coefficient. Resistors R9 and R11 are also connected to the non-inverted outputs of differential drivers Z3 and Z5 respectively, and these drivers also each receive a signal inverted an odd number of times so that resistors R9 and R11 also function as negative coefficients.

On the other hand, resistors R8, R10 and R12 are connected to differential drivers Z2, Z4 and Z6 respectively, which are each connected to the delay line after an even number of delay elements. These differential drivers thus receive a signal which is not inverted with respect to the input signal $S_n$, and thus in order to act as negative coefficients, resistors R8, R10 and R12 are each connected to the inverted output of the respective differential drivers. In this way, each of resistors R7 to R12 receive an output that is effectively inverted once as if by a single differential driver as shown in FIG. 2, and each act as negative coefficients.

Since resistors R1 to R6 are all connected so as to receive a non-inverted signal and act as positive coefficients to create the output voltage "Out," and resistors R7 to R12 are all connected so as to receive an inverted signal and act as negative coefficients to create the output voltage "Outb," it can thus be seen that the output of the circuit of FIG. 4 is identical to that of the circuit of FIG. 2.

According to one embodiment, the circuit of FIG. 4 is then simplified by replacing all of the differential drivers with regular, non-differential drivers of the type shown in FIG. 1, and by removing the resistors that were connected to the inverting outputs of the differential buffers. The resulting circuit is shown in FIG. 5.

Figure 5:
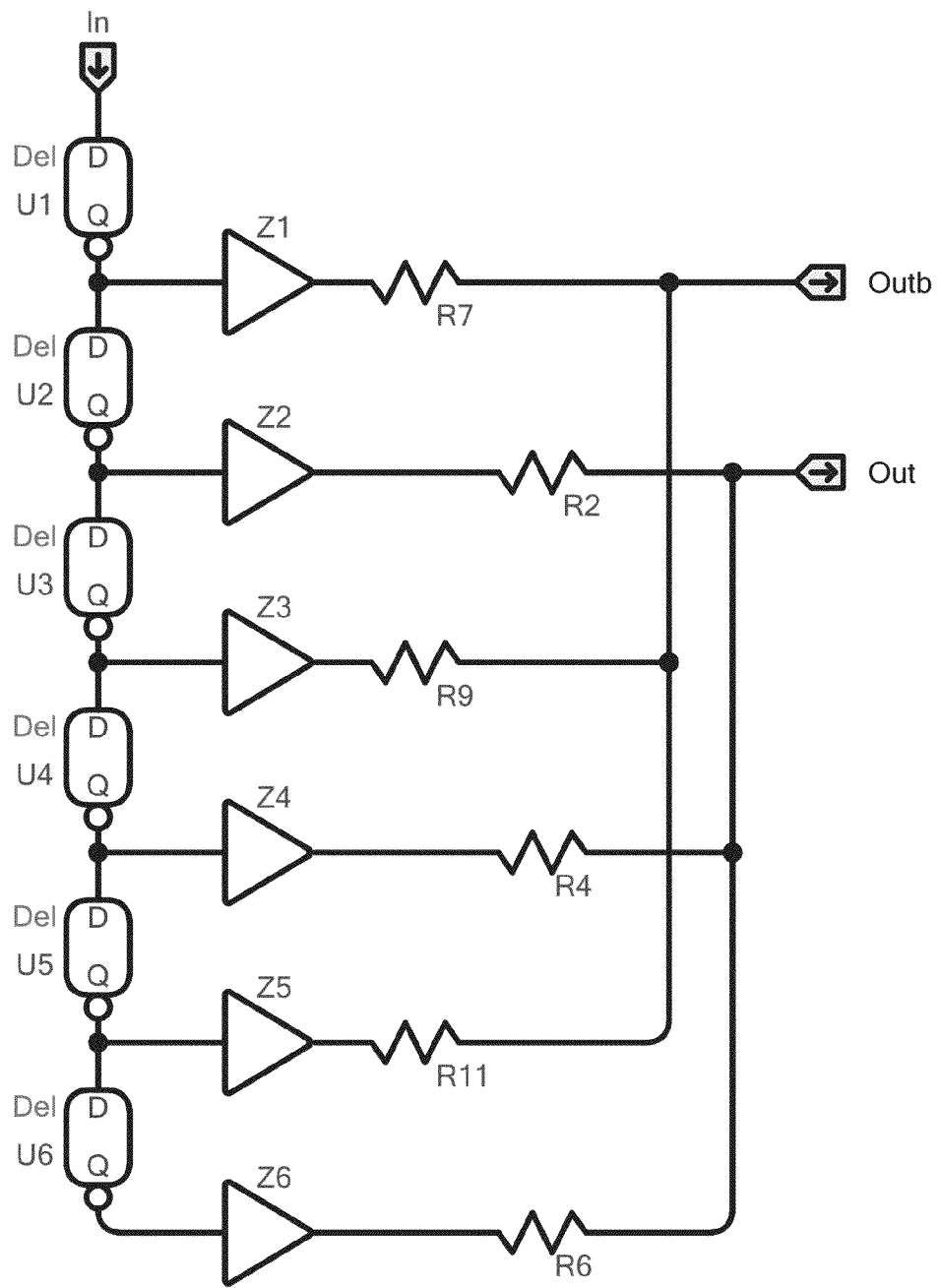
FIG. 5 is a block diagram of a finite impulse response (FIR) filter constructed according to one embodiment and having a differential output that is substantially the same as the output of the FIR filter of FIG. 5.

As seen in FIG. 5, the delay elements U1 to U6 are still inverting delay elements, but now all of the buffers Z1 to Z6 are simple, non-inverting buffers rather than differential buffers. Without using the inverting delay elements U1 to U6, this would have resulted only in the removal of the output signal "Outb," and would result in the circuit like that of FIG. 1. However, the use of inverting delay elements U1 to U6 allows for the production of two output signals "Out" and "Outb" with fewer resistors as shown in FIG. 5.

Half of the resistors which created the output signal "Out" in FIG. 4 remain, and the other half of the resistors that created "Out" are removed. Resistors R2, R4 and R6, which were connected to non-inverting outputs of differential drivers in FIG. 4, still produce output signal "Out" in FIGS. 5; resistors R1, R3 and R5, which were connected to inverting outputs of the differential drivers in FIG. 4, are now gone.

Similarly, resistors R7. R9 and R11, which were also connected to non-inverting outputs of differential drivers in FIG. 4, still produce output signal "Outb" FIG. 5, but resistors R8, R10 and R12, which were connected to inverting outputs of the differential buffers in FIG. 4, are also gone.

It will again be noted from FIG. 4 that resistors R7, R9 and R11, which contribute to output "Outb," have the same values as absent resistors R1, R3 and R5. Thus, if all of the Fourier coefficients are positive, the use of the inverting delay elements has the effect of causing the resistors to alternately contribute to the two outputs, so that, in this case, the odd-numbered resistor values contribute to "Outb," and the even-numbered resistor values contribute to "Out."

The use of only approximately half of the coefficients may seem inadequate to achieve a desired frequency response upon first impression. However, it should be noted that the circuits shown in FIGS. 1 through 5 are simplified in order to illustrate the discussion herein. Actual FIR filters are typically designed with approximately 80 to 120 coefficients, often around 100, and thus use almost that number of resistors (there is no resistor for a coefficient of zero, as explained below).

Thus, in the case of a set of about 100 Fourier coefficients, each signal in a differential output, "Out" and "Outb," will still be the sum of the outputs of approximately 40 to 50 resistors. It has been found in practice that the use of this many resistors, and thus representing this many coefficients from the Fourier transform, results in an output that remains a close approximation of the output that would be produced by the entire set of coefficients and all 100 corresponding resistors.

Since most of the Fourier coefficients for a desired frequency response will again typically be positive, merely directing those positive coefficients to one output and the remaining few negative coefficients to the other output would generally result in the outputs having very different numbers of contributing resistors, so that the output would be very unlikely to be even approximately complements. On the other hand, by using the inverting delay elements and the above analysis that treats the resistors as if they had been connected to differential buffers, the resistors that contribute to an output, and which correspond to the mostly positive coefficients, largely alternate between being connected to the non-inverting and inverting outputs of the buffers.

There are a few exceptions corresponding to negative coefficients, and to coefficients of zero. For example, it should also be noted again that, as above, FIG. 2 reflects only positive coefficients. If it were desired to instead implement the filter of FIG. 3, which reflects a negative coefficient, then it may be seen that in FIG. 3 resistor R10 contributes to output "Out" rather than output "Outb" as in FIG. 2. Thus, a circuit of the form of FIG. 5 corresponding to the circuit of FIG. 3 would have resistor R10 contributing to output "Out" instead of "Outb," so that resistors R1, R3, R5 and R10 would result in "Out" and only resistors R8 and R12 would contribute to "Outb."

Thus, when there is a negative Fourier coefficient, the resistor value contributes to the opposite output from what would be expected if there was a strict alternating from one output to the other. However, since as above there are relatively few negative coefficients, and only the resistors which would be attached to the non-inverting outputs of the differential buffers remain in a filter constructed according to the described method, approximately half of the resistors that would create each output in a conventional FIR filter according the prior art will remain in a filter constructed according to the described embodiment.

Figure 6:
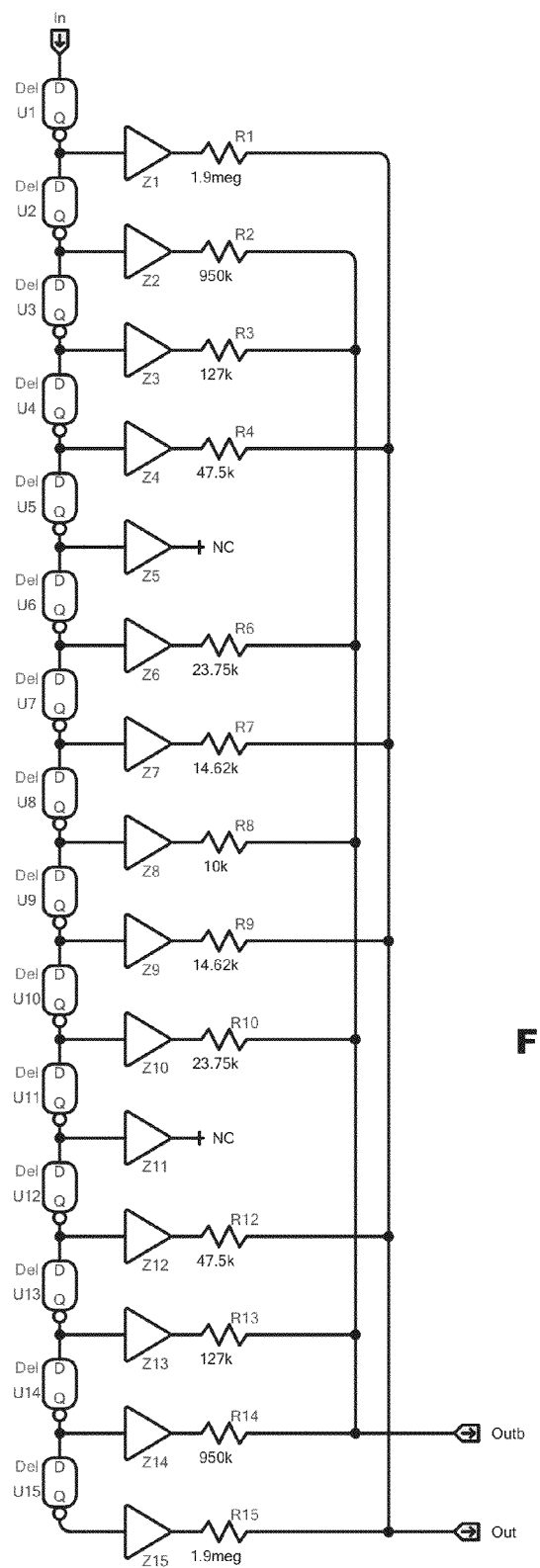
FIG. 6 is a block diagram of another finite impulse response (FIR) filter constructed according to one embodiment and having a differential output.

FIG. 6 shows another example of a circuit constructed according to one embodiment. Suppose a FIR filter is designed, either by hand or with standard design tools known in the art, having the following 15 Fourier coefficients:

{0.01 0.02 −0.15 −0.4 0 0.8 1.3 1.9 1.3 0.8 0 −0.4 −0.15 0.02 0.01}

Thus, a coefficient of 0.01 is to be used for the output of the first delay element, 0.02 for the output of the second delay element, −0.15 for the third delay element, etc.

Inverting these results in the following resistor values
{100 50 6.67 2.5 Inf 1.25 0.769 0.526 0.769 1.25 Inf 2.5 6.67 50 100}
where the values are in ohms (Ω), and "Inf" means an infinite value, i.e., an open circuit or no connection, that corresponds to a coefficient of zero. Note that even the negative coefficients result in positive resistor values, since physical resistors can only have positive values; the treatment of the negative coefficients will be addressed below.

Rather than try to make resistors in these values, the values are normalized to a scale that will result in values that are easier to construct. In the embodiment shown in FIG. 6, a minimum desired value is selected for the resistors of 10,000Ω, or 10 kΩ. To do this, each value listed above is multiplied by about 19,000, so that the smallest value of 0.526 becomes 10,000, and the first value of 100 becomes 1.9 megohms (MΩ). This results in the values above becoming:

{1.9 M 950 k 127 k 47.5 k Inf 23.75 k 14.62 k 10 k 14.62 k 23.75 k Inf 47.5 k 127 k 950 k 1.9 M}
where the values are again all in ohms.

The resulting circuit is shown in FIG. 6. Delay elements U1 to U15 are again inverting delay elements, each one inverting the incoming signal. Buffers Z1 to Z15 are connected to the delay line, each after a corresponding delay element. The resistors R1 to R4, R6 to R10, and R12 to R15 are each connected to the delay line after the corresponding buffers Z1 to Z4, Z6 to Z10, and Z12 to Z15. There are no resistors R5 or R11, since these values are "infinite" or open connections as above.

Which resistors contribute to which output is again determined by considering the output to which they would contribute to in a circuit using differential buffers. If one were to use differential buffers for buffers Z1 to Z15 and connect the resistors as described above, it would be seen that resistor R1, R4, R7, R9, R12, and R15 would be connected to non-inverting outputs of the differential buffers and would contribute to output signal "Out." These resistors thus remain in the circuit of FIG. 6 and produce output signal "Out."

Similarly, in such a case, resistors R2, R3, R6, R8, R10, R13 and R14 would also be connected to non-inverting outputs of the differential buffers, and would contribute to output signal "Outb." Thus, these resistors also remain in the circuit of FIG. 6 and produce output signal "Outb."

If all of the coefficients were positive, it would be expected that all of the odd-numbered resistors would contribute to one output, and all of the even-numbered resistors to contribute to the other output as in FIG. 5. It will be seen in FIG. 6 that this is in fact generally the case. However, since the coefficients corresponding to resistors R3, R4, R12 and R13 are negative, these resistors each contribute to the opposite output from what they would in a filter with only positive coefficients. Resistors R5 and R11 are again open connections and thus do not contribute to either output in FIG. 6.

In this case, there are six resistors contributing to one output and seven contributing to the other output. This is believed to be a typical result, i.e., approximately half of the resistors that would contribute to each output in a conventional differential output FIR filter will contribute to each output in a FIR filter constructed according to this embodiment. (Again, there are two open connections in FIG. 6; these would be open connections in a conventional FIR filter as well.)

it can be seen from this that the determination of which resistors are to be connected to which output may be phrased as follows. For the nth resistor, if n is odd and the corresponding coefficient is positive, or if n is even and the corresponding coefficient is negative, then the resistor contributes to one output, here "Out." All of the other resistors contribute to the other output, here "Outb." (Again, there are no resistors R5 or R11, as their values would be infinite, i.e., an open circuit.) Note that since the outputs are complements, they are approximately the same except for their sign, i.e., positive or negative, and thus either may be designated as "Out."

Since the outputs are complements, the connections of the resistor outputs may also be reversed, and yield the same result with only reversed signs. Thus, if, for an nth resistor, n is odd and the corresponding coefficient is negative (rather than positive as in the example above), or if n is even and the corresponding coefficient is positive (rather than negative as in the example above), then the resistor contributes to one output, and the other resistors contribute to the other output.

It should again be noted that in a typical case a FIR filter will have more values than the 15 shown in FIG. 6. Also, while in the example of FIG. 6 the resistors are scaled so that the smallest resistor has a value of 10 kΩ, one of skill in the art will be able to select a desired scale for the resistor values with a minimum value other than the 10 kΩ used in the example above.

Still further, one of skill in the art will appreciate that the larger the resistor value becomes, the smaller the contribution of the output of the resistor to the overall output will be. Thus, it is believed that it is common in the art for designers to regard sufficiently large resistor values as effectively infinite, and to simply treat such values as open connections rather than trying to construct resistors of such high values. In one embodiment, it is assumed that any resistor having a value of more than 1000 times the value of the smallest resistor will not make a noticeable contribution to the output, and thus resistors having values greater than that are treated as open connections. Thus, in the example of FIG. 6, if a Fourier coefficient would result in a resistor having a value of over 1000 times 10 kΩ, or 10 MΩ, that resistor would simply be treated as an open connection.

Figure 7:
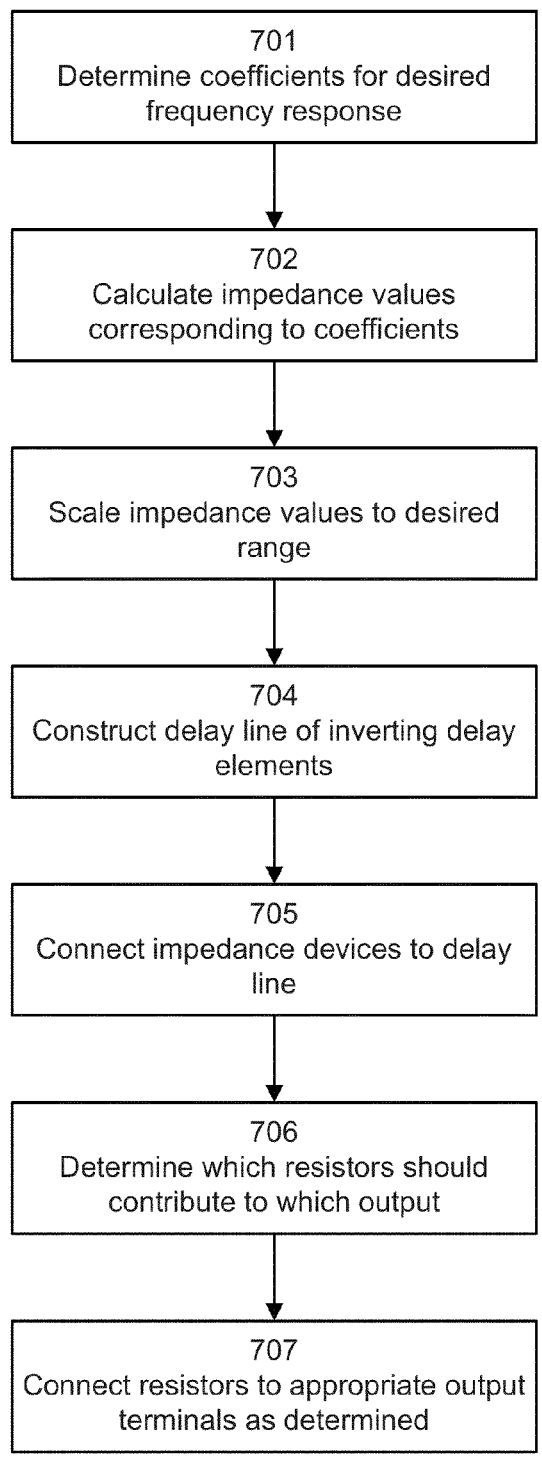
FIG. 7 is a flowchart illustrating one possible embodiment of a method as described herein embodied in software.

FIG. 7 is a flowchart of a method of constructing a FIR filter having differential outputs according to one embodiment. At step 701, a set of Fourier coefficients is determined that produces a desired frequency response. The Fourier coefficients may be determined by a designer, or may be the result of a commercially available software program that accepts a desired frequency response as input and provides a set of coefficients as output. One such program is MATLAB© from MathWorks™.

At step 702, a set of impedance values corresponding to the Fourier coefficients are calculated. An impedance value is calculated as the inverse of each coefficient; however, as above, a positive value will be calculated for a negative coefficient since only positive impedances may be constructed. At step 703, the impedance values are scaled by a desired amount as described above, so that the range of scaled impedance values may be more easily constructed than the values calculated at step 702.

At step 704, a delay line of inverting delay elements is constructed, of the same length as the number of Fourier coefficients. At step 705, each impedance device is connected to the delay line after the appropriate delay element, i.e., the impedance device corresponding to the first coefficient is connected after the first delay element, the impedance device corresponding to the second coefficient is connected after the second delay element, etc. Where the coefficient is zero, and thus the impedance value would be infinite, or the impedance value is large enough to make virtually no contribution to the output as above, no impedance is device is connected after the corresponding delay element.

At step 706, it is determined which resistors should contribute to which output. As described above, this may be done by considering which resistors would be connected to the non-inverting outputs of differential buffers in a FIR filter constructed according to the conventional prior art. Thus, as shown in FIGS. 4 and 5, one would design a FIR filter using a delay line of inverting elements, attach differential buffers between the delay elements, connect the resistors to the differential buffers as described above, and then remove the resistors connected to the inverting outputs of the differential buffers and change the buffers to norm 1 non-inverting buffers.

Alternatively, the determination of step 706 may more easily be made by considering whether the number of the resistor is odd or even, and the sign of the coefficient, as described above, i.e., for the nth resistor, if n is odd and the corresponding coefficient is positive, or if n is even and the corresponding coefficient is negative, then the resistor contributes to one output, and all of the other resistors contribute to the other output. As still another alternative, this may be reversed such that if, for an nth resistor, n is odd and the corresponding coefficient is negative, or if n is even and the corresponding coefficient is positive, then the resistor contributes to one output, and the other resistors contribute to the other output.

Finally, at step 707, the appropriate resistors are connected to each output terminal as determined in step 706, resulting in a differential output of two signals having approximately the same frequency response and different signs. Thus, the circuit will have only one full set of resistors corresponding to the Fourier coefficients of the desired frequency response, which is half of the resistors that would be used in a conventional FIR filter having differential buffers and a differential output. The circuit also uses simpler buffers, since the differential buffers of the prior art are no longer required.

The use of the inverting delay line results in another advantage as well, in that it minimizes pulse width distortion. Pulse width distortion is an effect that results from a delay element typically having a slightly different delay when processing a positive edge than the delay when processing a negative edge. For example, in processing a rising or positive edge, a particular delay element may produce a signal having a delay of 101 picoseconds (ps), while in processing a falling or negative edge the same delay element may result in a delay of only 99 ps. (Such a delay element would typically be considered to have a nominal value of a 100 ps delay.)

If a pulse with a width of 1 nanosecond (ns) is passed down a delay line having 100 delay elements with these specifications, a positive edge will appear at the output 10.1 ns after it is input (i.e., 101 ps times 100 delay elements), while a negative edge will arrive 9.9 ns after it is input (i.e., 99 ps times 100 delay elements). In this case, the input pulse of 1 ns width will appear at the output as a pulse having a width of only 800 ps, due to the relative arrival of the edges.

An inverting delay line avoids this problem, since any edge is alternately processed by one delay element as a positive edge and by the next element as a negative edge (or vice versa, depending on whether the edge was positive or negative to begin with). Because of this, there is no opportunity for the filter to accumulate pulse width distortion; in the example given, two delay elements will result in a combined delay of 101 ps plus 99 ps, or 200 ps, i.e., twice the nominal value, and the edges will arrive at the output with the expected relationship. (If the number of delay elements is odd, then the variation due to the last delay element will still be present, i.e., the 2 ps difference between positive and negative edges. However, this is minimal compared to the cumulative effect of 100 or more delay elements.)

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, while resistors have been used for ease of illustration, as noted above inductors, capacitors or other elements having impedance may be used. Still further, while individual resistors providing the desired resistor values are shown herein, this is not required. In some cases a desired resistor value may be easily obtained from a single resistor, while in other cases it may be easier and/or more cost effective to obtain a desired resistor value from some series and/or parallel combination of a plurality of resistors; how to calculate the effective resistance value from individual resistors connected in series and parallel is well understood by those of skill in the art.

It should also be appreciated that the described method and apparatus can be implemented in numerous ways, including as a process, an apparatus, or a system. The methods described herein may be implemented by program instructions for instructing a processor to perform such methods, and such instructions recorded on a computer readable storage medium such as a hard disk drive, floppy disk, optical disc such as a compact disc (CD) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of designing a finite impulse response filter having a desired frequency response and a differential output having a first output signal and a complement output signal, comprising:
    determining a set of N Fourier coefficients that result in the desired impulse response;
    calculating a set of N impedance values that correspond to the determined Fourier coefficients;
    scaling the calculated impedance values to a desired range;
    constructing an inverting delay line comprised of N inverting delay elements;
    connecting impedance devices having the scaled impedance values to the delay line, one after each delay element in the order of the Fourier coefficients to which the impedance values correspond;
    determining which impedance devices should contribute to the first output signal and which impedance devices should contribute to the complement output signal; and
    connecting the impedance devices which should contribute to the first output signal to a first output terminal and the impedance devices which should contribute to the complement output signal to the second output terminal.

2. The method of claim 1, wherein determining which impedance devices should contribute to the first output signal and which impedance devices should contribute to the complement output signal further comprises:
    for a particular impedance device n, where n=1 to N:
        if n is odd and the corresponding Fourier coefficient is positive, or if n is even and the corresponding Fourier coefficient is negative, then determining that the impedance device should contribute to the first output signal; and
        determining that all other impedance devices should contribute to the complement output signal.

3. The method of claim 1, wherein determining which impedance devices should contribute to the first output signal and which impedance devices should contribute to the complement output signal further comprises:
    for a particular impedance device n, where n=1 N:
        if n is odd and the corresponding Fourier coefficient is negative, or if n is even and the corresponding Fourier coefficient is positive, then determining that the impedance device should contribute to the first output signal; and
        determining that all other impedance devices should contribute to the complement output signal.

4. The method of claim 1, wherein the impedance devices are resistors.

5. The method of claim 1, wherein the impedance devices are inductors.

6. The method of claim 1, wherein the impedance devices are capacitors.

7. The method of claim 1, wherein determining a set of N Fourier coefficients further comprises mathematically calculating the sets of Fourier coefficients.

8. The method of claim 1, wherein determining a set of N Fourier coefficients further comprises determining the sets of Fourier coefficients by an iterative method.

9. The method of claim 8, wherein determining the set of N Fourier coefficients by an iterative method further comprises determining the N Fourier coefficients by a Parks-McClellan method.

10. The method of claim 1, wherein attaching impedance devices having the scaled impedance values to the delay line further comprises leaving an open circuit after any delay element for which the corresponding Fourier coefficient is zero.

11. The method of claim 1, wherein attaching impedance devices having the scaled impedance values to the delay line further comprises leaving an open circuit after an delay element for which the corresponding scaled impedance value exceeds a predetermined amount.

12. The method of claim 11, wherein the predetermined amount of a scaled impedance value is 1000 times the smallest scaled impedance value.

13. A method of designing a finite impulse response filter having a desired frequency response and a differential output having a first output signal and a complement output signal, comprising:
    determining a set of N Fourier coefficients that result in the desired impulse response;
    calculating a set of N impedance values that correspond to the determined Fourier coefficients;
    scaling the calculated impedance values to a desired range;
    constructing an inverting delay line comprised of N inverting delay elements;
    connecting N differential buffers to the delay line, one after each delay element, each differential buffer having an input, an inverting output and a non-inverting output, with the input connected to the delay line;
    connecting a first set of impedance devices having the scaled impedance values to the differential buffers in the order of the Fourier coefficients to which the impedance values correspond, where for each impedance device in the first set of impedance devices n=1 to N, if n is odd the impedance device is attached to the non-inverting output of the respective differential buffer and if n is even the impedance device is attached to the inverting output of the respective differential buffer;
    for each Fourier coefficient n=1 to N that is positive, connecting the output of the corresponding impedance device of the first set of impedance devices to a first output terminal;

for each Fourier coefficient n=1 to N that is negative, connecting the output of the corresponding impedance device of the first set of impedance devices to a second output terminal;

connecting a second set of impedance devices having the scaled impedance values to the differential buffers in the order of the Fourier coefficients to which the impedance values correspond, each impedance device in the second set of impedance devices attached to the opposite output of the respective differential buffer from the corresponding impedance device of the first set of impedance devices;

for each Fourier coefficient n=1 to N that is positive, connecting the output of the corresponding impedance device of the second set of impedance devices to a second output terminal;

for each Fourier coefficient n=1 to N that is negative, connecting the output of the corresponding impedance device of the second set of impedance devices to a first output terminal;

removing all of the impedance devices connected to the inverting outputs of the differential buffers; and replacing the differential buffers with buffers having only non-inverting outputs.

14. A finite impulse response filter having a desired frequency response and a differential output having a first output signal and a complement output signal, comprising:

an inverting delay line comprised of N inverting delay elements;

N impedance devices connected to the delay line, one after each delay element, the impedance devices having impedance values corresponding to N Fourier coefficients that result in the desired frequency response and connected to the delay line in the order of the Fourier coefficients to which the impedance values correspond;

a first output terminal connected to a plurality of the impedance devices, where for a particular impedance device n=1 to N, if n is odd and the corresponding Fourier coefficient is positive, or if n is even and the corresponding Fourier coefficient is negative, the impedance device is one of the plurality of impedance devices connected to the first output terminal; and a complement output terminal connected to the impedance devices which are not connected to the first output terminal.

15. A non-transitory computer readable storage medium having embodied thereon instructions for causing a computing device to execute a method of designing a finite impulse response filter having a desired frequency response and a differential output having a first output signal and a complement output signal, comprising:

determining a set N Fourier coefficients that result the desired impulse response;

calculating a set of N impedance values that correspond to the determined Fourier coefficients;

scaling the calculated impedance values to a desired range;

constructing an inverting delay line comprised of N inverting delay elements;

connecting impedance devices having the scaled impedance values to the delay line, one after each delay element in the order of the Fourier coefficients to which the impedance values correspond;

determining which impedance devices should contribute to the first output signal and which impedance devices should contribute to the complement output signal; and connecting the impedance devices which should contribute to the first output signal to a first output terminal and the impedance devices which should contribute to the complement output signal to the a second output terminal.

* * * * *